United States Patent
Jeon

(10) Patent No.: US 7,855,921 B2
(45) Date of Patent: Dec. 21, 2010

(54) ERASE METHOD AND SOFT PROGRAMMING METHOD OF NON-VOLATILE MEMORY DEVICE

(75) Inventor: Yoo Nam Jeon, Kyeongki-do (KR)

(73) Assignee: Hynix Semiconductor Inc., Icheon-si, Kyoungki-do (KR)

(*) Notice: Subject to any disclaimer, the term of this patent is extended or adjusted under 35 U.S.C. 154(b) by 165 days.

(21) Appl. No.: 12/131,962

(22) Filed: Jun. 3, 2008

(65) Prior Publication Data
US 2009/0168544 A1 Jul. 2, 2009

(30) Foreign Application Priority Data
Dec. 28, 2007 (KR) .................. 10-2007-0140147

(51) Int. Cl.
*G11C 16/04* (2006.01)
(52) U.S. Cl. .................. 365/185.29; 365/185.17; 365/185.22
(58) Field of Classification Search ............ 365/185.29, 365/185.17, 185.22
See application file for complete search history.

(56) References Cited

U.S. PATENT DOCUMENTS 5,768,197 A * 6/1998 Choi ........................ 365/200
7,668,019 B2 * 2/2010 Byeon ..................... 365/185.29
7,672,170 B2 * 3/2010 Lee et al. ................ 365/185.27
2003/0214853 A1 * 11/2003 Hosono et al. .............. 365/200
2007/0183220 A1 * 8/2007 Aritome ................. 365/185.29

FOREIGN PATENT DOCUMENTS

KR 10-2006-0107697 10/2006
KR 1020070045308 A 5/2007

OTHER PUBLICATIONS

Office Action dated Sep. 30, 2009, for Korean application No. 10-2007-0140147.
The Notice of Allowance to the Korean Patent Application No. 10-2007-0140147, Dec. 28, 2009, 2 pages, KIPA, Korea.

* cited by examiner

*Primary Examiner*—Hoai V Ho
*Assistant Examiner*—Jason Lappas
(74) *Attorney, Agent, or Firm*—Lowe Hauptman Ham & Berner LLP

(57) ABSTRACT

An erase method and a soft programming method of a non-volatile memory device includes performing an erase operation on a memory cell block; applying a pass voltage to a memory cell adjacent to a select transistor of the memory cell block; applying a soft program voltage to the remaining memory cells of the memory cell block; and performing a soft program operation.

8 Claims, 4 Drawing Sheets

ERASE METHOD AND SOFT PROGRAMMING METHOD OF NON-VOLATILE MEMORY DEVICE

CROSS-REFERENCES TO RELATED APPLICATIONS

The present application claims priority to Korean patent application number 10-2007-0140147, filed on Dec. 28, 2007, which is incorporated by reference in its entirety.

BACKGROUND OF THE INVENTION

The present invention relates to an erase method and a soft programming method of a non-volatile memory device.

Recently, there are increasing demands for non-volatile memory devices which can be electrically programmed and erased and do not need the refresh function of rewriting data at certain intervals.

A non-volatile memory device generally includes a memory cell array in which cells for storing data therein are arranged in matrix form, and a page buffer for writing memory into specific cells of the memory cell array or reading memory stored in a specific cell.

Here, an interference phenomenon in which the threshold voltage is changed depending on a change of the threshold voltage of peri cells can be generated in a non-volatile memory cell. The greater the threshold voltage of peri cells changes, the greater the interference phenomenon occurs.

As a method of reducing the interference phenomenon, there has been known a method of improving the distributions of the threshold voltage of an erased cell by making the threshold voltage close to 0V to the greatest extent. Through this distribution, a change of the threshold voltage when peri cells are programmed can be reduced.

However, when program disturbance occurs due to this method, a margin is reduced. In particular, due to the program disturbance, the outermost cell adjacent to each select transistor has a greater threshold voltage change than that of other cells. Consequently, disturbance failure occurs in the outermost cell.

Electron-hole pairs are formed at a portion where the gate of each select transistor is overlapped with the junction by a gate induced drain leakage (GIDL) phenomenon. Electrons generated at this time are accelerated toward a channel because of a high channel boosting voltage. Accordingly, electrons move to the floating gate due to a soft program voltage applied to the word line of the outermost cell, therefore, the threshold voltage of a cell is increased. If the threshold voltage becomes higher than a specific voltage, a disturbance phenomenon where an erase state of cells shift to a program state is generated.

SUMMARY OF THE INVENTION

The present invention is directed towards an erase method and a soft programming method, which can prevent the disturbance phenomenon between each select transistor and the outermost cell adjacent thereto.

A soft programming method of a non-volatile memory device according to an aspect of the present invention includes providing a memory cell block on which an erase operation has been performed, setting a pass voltage so that the pass voltage is applied to memory cells adjacent to each select transistors, of memory cells on which the erase operation has been performed, setting a soft program voltage so that the soft program voltage is applied to the remaining memory cells, and performing a soft program operation according to the set voltage.

An erase method of a non-volatile memory device according to another aspect of the present invention includes performing an erase operation on a memory cell block, performing a soft program operation by applying a pass voltage to memory cells adjacent to each select transistors and a soft program voltage to the remaining memory cells, and repeatedly performing the program operation and a verify operation using a first erase verify voltage until a cell programmed to have the first erase verify voltage or higher is generated.

DESCRIPTION OF SPECIFIC EMBODIMENTS

Now, specific embodiments according to the present invention will be described with reference to the accompanying drawings. However, the present invention is not limited to the disclosed embodiments, but may be implemented in various manners. The embodiments are provided to complete the disclosure of the present invention and to allow those having ordinary skill in the art to understand the scope of the present invention.

Figure 1:
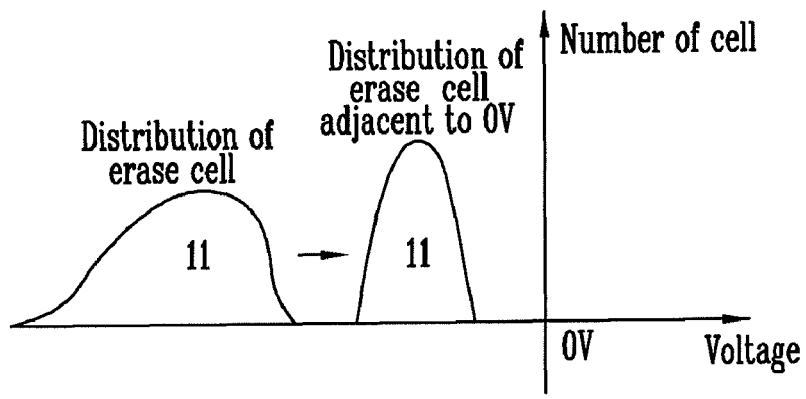
FIG. 1 is a diagram illustrating the concept of a soft program, which is applied to the present invention.

FIG. 1 is a diagram illustrating the concept of a soft program, which is applied to the present invention.

In a non-volatile memory cell, an interference phenomenon where the threshold voltage is changed according to a change of the threshold voltage of peri cells can be generated. The greater the threshold voltage of peri cells changes, the greater the interference phenomenon occurs. That is, a program operation is performed on an erase cell, which in result increases the threshold voltage of the cell. Thus, the erase cell becomes a program cell. If a change of the threshold voltage is great, the influence of the disturbance phenomenon becomes greater.

As a method of reducing the interference phenomenon, there has been known a method of improving the distributions of the threshold voltage of an erased cell by making the threshold voltage close to 0V to the greatest extent. In this method, a program operation is performed on the erased cell in order to increase the threshold voltage a little. This operation is also called a soft program. The distributions can reduce a change of the threshold voltage of a specific cell when the cell is programmed.

Figure 2:
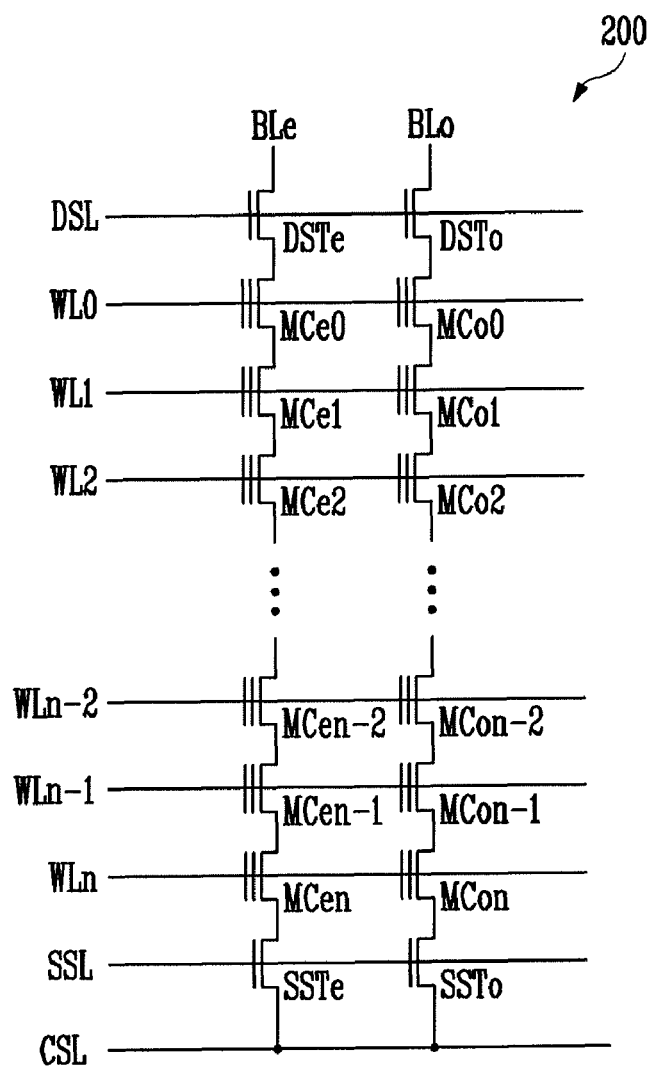
FIG. 2 is a schematic circuit diagram illustrating a memory cell array of a non-volatile memory device, which is applied to the present invention.

FIG. 2 is a schematic circuit diagram showing a memory cell array of a non-volatile memory device, which is applied to the present invention.

A memory cell array 200 includes drain select transistors DSTe, DSTo connected between a bit line and memory cells, and source select transistors SSTe, SSTo connected between a common source line and memory cells.

The memory cell array 200 includes a plurality of cell strings, which comprise a plurality of memory cells MCe0 to MCen, MCo0 to MCon connected in series between the source select transistors SSTe, SSTo and the drain select transistors DSTe, DSTo.

The respective memory cells can be divided into respective pages, that is, groups of cells, each of which is connected to the same word lines WL0 to WLn and is supplied with various program voltages, read voltages, etc. That is, cells belonging to the same page are connected to the same word line.

The source select transistors SSTe, SSTo are connected to the same source select line SSL and are applied with various voltages. The drain select transistors DSTe, DSTo are connected to the same drain select line DSL and applied with various voltages.

Further, the outermost cells MCe0, MCo0 adjacent to a drain select transistor and the outermost cells MCen, MCon adjacent to a source select transistor have a greater threshold voltage change than that of other cells due to program disturbance. Thus, the present invention proposes a soft programming method of minimizing the threshold voltage change of the outermost cells.

Figure 3:
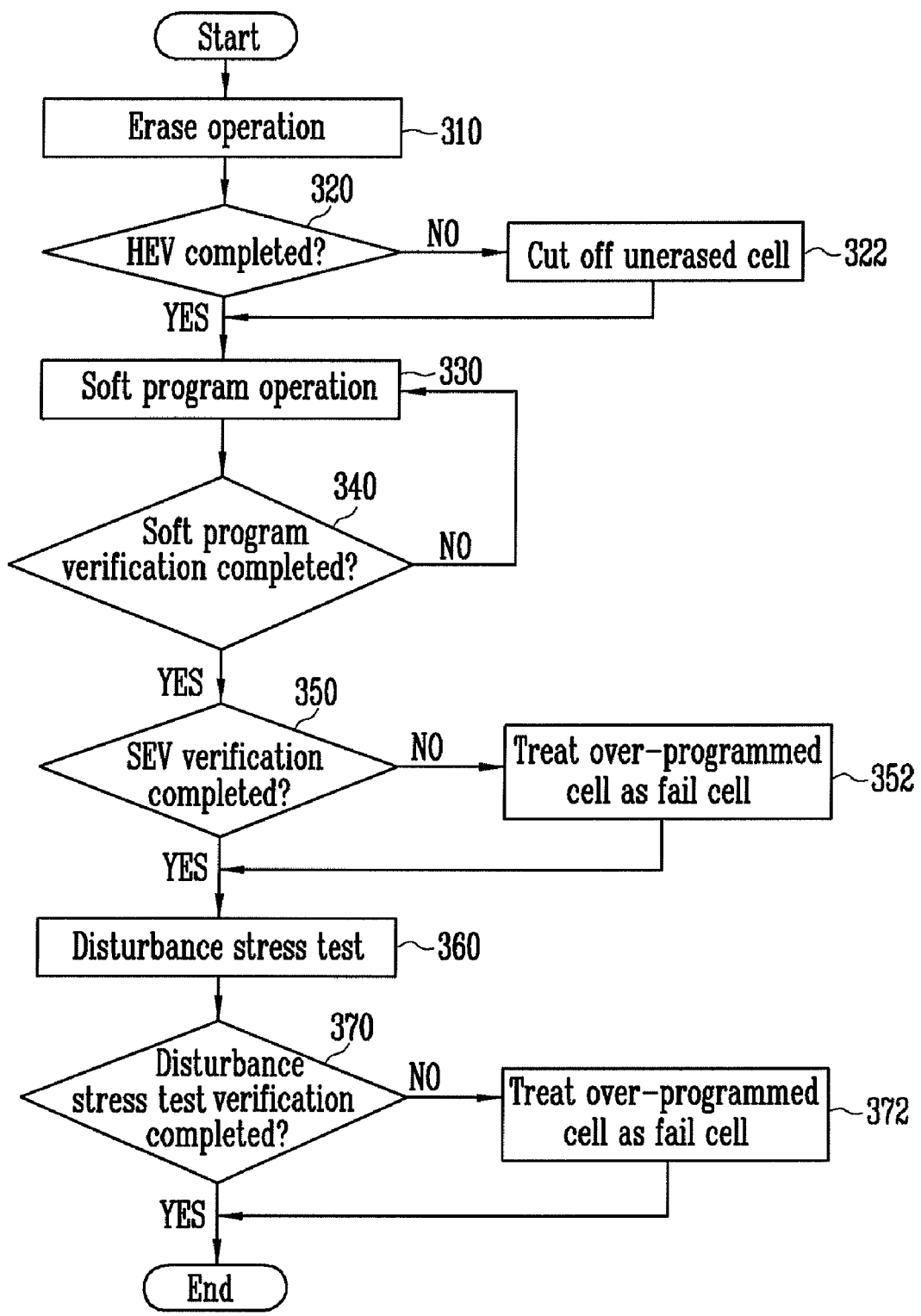
FIG. 3 is a flowchart illustrating an erase operation and a soft program operation of a non-volatile memory device, which is applied to the present invention.
Figure 4A:
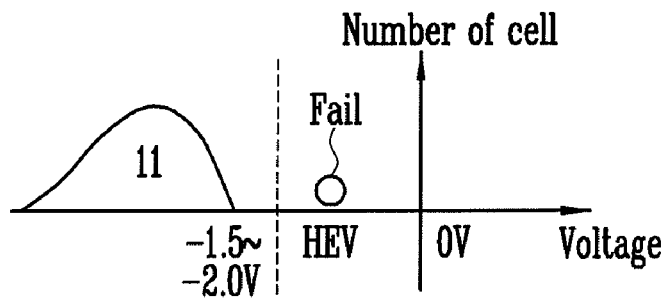
FIGS. 4A to 4C show distributions for describing a detailed process of an erase operation and a soft program operation.
Figure 4B:
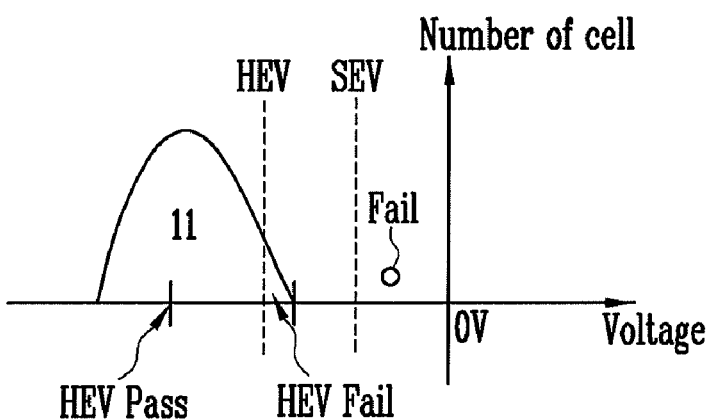
Figure 4C:
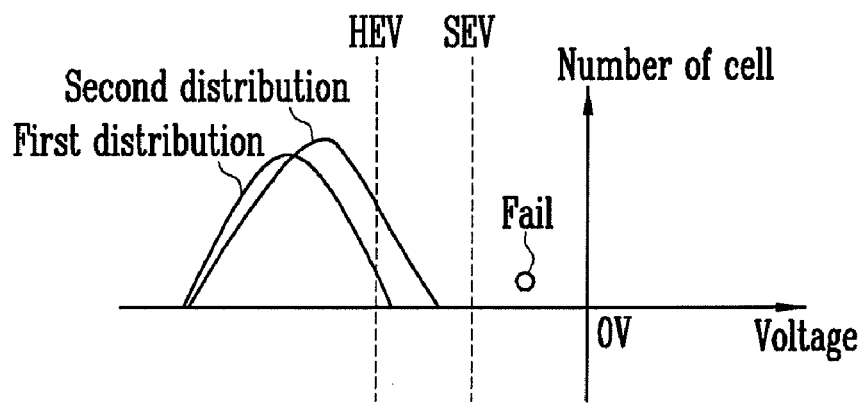

FIG. 3 is a flowchart showing an erase operation and a soft program operation of a non-volatile memory device, which is applied to the present invention. FIGS. 4A to 4C show distributions for describing a detailed process of an erase operation and a soft program operation.

Referring to FIG. 3, an erase operation is performed on a memory cell block at step 310.

Respective cells become to have a negative threshold voltage through the erase operation. A maximum threshold voltage is approximately in the range of −1.5 to −2.0V.

Next, it is verified whether there are cells programmed to have a threshold voltage higher than a hard erase verify (HEV) voltage through the erase operation at step 320. This process is called a HEV process. That is, it is determined whether HEV has been completed. Here, each word line is applied with a verify voltage of approximately 0V.

If, as a result of the verification, there is a cell having a threshold voltage higher than the HEV voltage, which means that erasure has not been completed successfully, corresponding cells are cut off at step 322.

Referring to FIG. 4A, it can be seen that although the erase operation has been completed, there exist some cells that have not been erased, that is, cells having a threshold voltage higher than the HEV voltage. These cells are cut off.

Referring back to FIG. 3, as a result of the verification, if erasure has been completed, a soft program operation is performed at step 330.

In the embodiments of the present invention, the soft program operation is not performed on the outermost cells in order to minimize a threshold voltage change of the outermost cells.

That is, when the soft program operation is performed on a specific block, a pass voltage Vpass is applied to a word line connected to the outermost cell and a soft program voltage Vpgm is applied to a word line connected to the remaining cells, so that the soft program operation is not performed on the outermost cell.

At this time, the soft program voltage can be in the range of 14 to 16V. The pass voltage can be in the range of approximately 6 to 7V.

It is then determined whether a verify operation has been performed on the soft program operation at step 340.

The verify operation is completed when there is a cell programmed over the HEV voltage. That is, when there is no cell programmed over the HEV voltage, the soft program operation is repeatedly performed. When there is a cell programmed over the HEV voltage, the soft program operation is finished.

Referring to FIG. 4B, it can be seen that an overall distribution is narrowed when compared with that of FIG. 4A through the soft program operation. Further, a maximum threshold voltage value is increased. If a cell having the maximum threshold voltage value higher than the HEV voltage exists, the soft program operation is finished.

Referring back to FIG. 3, it is determined next whether there exists a cell programmed over a soft erase verify (SEV) voltage through the soft program operation at step 350. This process is called a SEV process. Here, each word line is applied with a verify voltage of approximately 0.4V.

Cells that have been cut off by the HEV voltage in FIG. 4A can be programmed over a SEV voltage through the soft program operation, as shown in FIG. 4B. These cells are treated as fail cells at step 352. For example, corresponding cells are determined to be fail cells, and a process of repairing a column with the corresponding cells to success cells or a process of treating a corresponding block itself as a fail block can be performed.

Next, a disturbance stress test is performed at step 360. This process is a process of setting a program-inhibition state to each cell and testing the change degree of the threshold voltage when a program voltage is applied.

That is, when a high-level voltage is applied to the bit line of a target test cell, a program voltage is applied to the word line of a corresponding cell, and a pass voltage is applied to the word line of the remaining cells, a gate voltage of the target test cell is increased due to a channel boosting phenomenon. Thus, the cell should not be programmed ideally. However, this test process is performed to determine an existence of a programmed cell on such conditions.

The outermost cell has a greater threshold voltage change than that of other cells due to program disturbance. Thus, in the prior art, a plurality of disturbance fails were generated in the outermost cells. However, if the soft program is not performed on the outermost cell as in the present invention, sensing margin is sufficient although the threshold voltage is changed by disturbance. Accordingly, disturbance fail is not generated.

Verification is then performed on the disturbance stress test at step 370. Here, a word line of a target cell for verification is applied with a voltage of approximately 0.6V.

Referring to FIG. 4C, it can be seen that the voltage of a distribution (a second distribution) after the disturbance stress test is higher than that of a distribution (a first distribution) before the disturbance stress test. In this test process, when there is a cell programmed over the SEV voltage, a process of treating as fail cell is performed at step 372.

Figure 5:
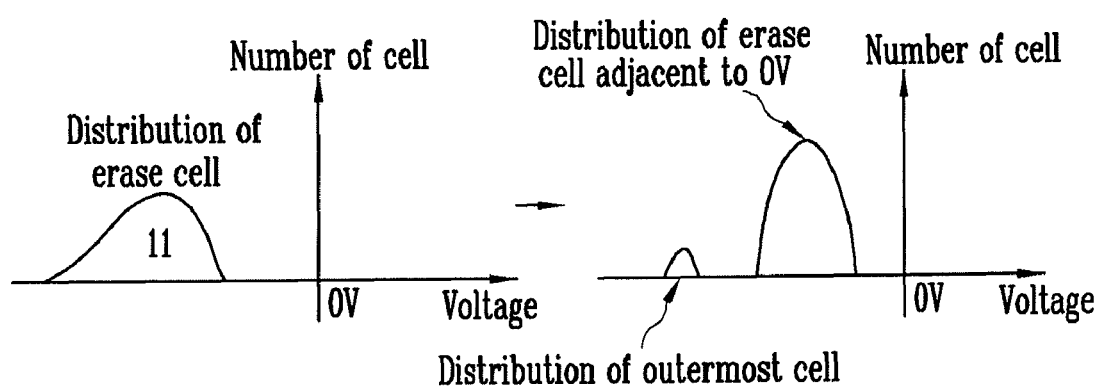
FIG. 5 shows threshold voltage distributions after the erase operation of a non-volatile memory device according to an embodiment of the present invention.

FIG. 5 shows threshold voltage distributions after the erase operation of a non-volatile memory device according to an embodiment of the present invention.

Because a pass voltage is applied to a word line of the outermost cell so that the soft program operation is not performed on the outermost cell, it can be seen from FIG. 5 that a distribution of the outermost cell is separated from that of the remaining cells and the threshold voltage of the outermost cell is lower than that of the remaining cells. If the soft program operation is not performed on the outermost cell as described above, a disturbance phenomenon in which cells of an erase state change to a program state can be reduced.

According to the present invention, a soft program is not performed on a memory cell adjacent to a select transistor during the soft program operation. Accordingly, at the time of the soft program operation, a reduction in disturbance margin of memory cells adjacent to the select transistor can be prevented.

The embodiments disclosed herein have been proposed to allow a person of ordinary skill in the art to easily implement the present invention. Therefore, the scope of the present invention is not limited by or to the embodiments as described above, and should be construed to be defined only by the appended claims and their equivalents.

What is claimed is:

1. An erase method of a non-volatile memory device, comprising:
    performing an erase operation on a memory cell block;
    performing a soft program operation, by applying a pass voltage to outermost cells of the memory cell block, the outermost cells being a first memory cell adjacent to a source select transistor and a second memory cell adjacent to a drain select transistor, and by applying a soft program voltage to the remaining memory cells of the memory cell block;
    repeating the soft program operation and a verify operation using a first erase verify voltage until a cell programmed to have the first erase verify voltage or higher is generated:
    verifying whether there is a cell programmed over a second erase verify voltage higher than the first erase verify voltage: and
    treating a cell, which is programmed over the second erase verify voltage, as a fail cell.

2. The erase method of claim 1, further comprising:
    verifying whether there are cells programmed to have a threshold voltage higher than the first erase verify voltage through the erase operation; and
    cutting off a cell having the threshold voltage higher than the first erase verify voltage.

3. The erase method of claim 1, further comprising:
    performing a disturbance stress test.

4. The erase method of claim 3, further comprising:
    performing verification on the disturbance stress test; and
    treating a cell, which is programmed over a second erase verify voltage, as a fail cell.

5. The erase method of claim 1, wherein the applying of the pass voltage to the outermost cells when performing the soft program operation prevents a disturbance phenomenon from occurring.

6. A soft programming method of a non-volatile memory device, comprising the steps of:
    performing an erase operation on a memory cell block;
    performing a soft program operation to memory cells other than outermost cells, the outermost cells being a first memory cell adjacent to a source select transistor and a second memory cell adjacent to a drain select transistor, in the memory cell block;
    repeating the soft program operation and a verify operation using a first erase verify voltage until a cell programmed to have the first erase verify voltage or higher is generated:
    verifying whether there is a cell programmed over a second erase verify voltage higher than the first erase verify voltage: and
    treating a cell, which is programmed over the second erase verify voltage, as a fail cell.

7. The soft programming method of claim 1, wherein the pass voltage is within a range of 6V to 7V.

8. The soft program method of claim 1, wherein the soft program voltage is within a range of 14V to 16V.

* * * * *